United States Patent [19]
Adkins

[11] Patent Number: 6,163,233
[45] Date of Patent: Dec. 19, 2000

[54] WAVEGUIDE WITH SIGNAL TRACK CROSS-OVER AND VARIABLE FEATURES

[75] Inventor: Calvin L. Adkins, Malabar, Fla.

[73] Assignee: Harris Corporation, Palm Bay, Fla.

[21] Appl. No.: 09/126,672

[22] Filed: Jul. 30, 1998

[51] Int. Cl.[7] .................................................. H01P 3/08
[52] U.S. Cl. ............................... 333/1; 333/238; 333/246
[58] Field of Search ............................... 333/1, 128, 136, 333/238, 246

[56] References Cited

U.S. PATENT DOCUMENTS

| | | | |
|---|---|---|---|
| 3,104,363 | 9/1963 | Butler | 333/246 |
| 3,155,881 | 11/1964 | St. Jean | 333/1 X |
| 3,398,232 | 8/1968 | Hoffman | 333/238 X |
| 3,740,678 | 6/1973 | Hill | 333/238 |
| 4,362,899 | 12/1982 | Borrill | 174/36 |
| 4,374,368 | 2/1983 | Viola et al. | 333/246 X |
| 4,450,418 | 5/1984 | Yum et al. | 333/246 X |
| 4,513,266 | 4/1985 | Ishihara | 333/238 |
| 4,673,904 | 6/1987 | Landis | 333/238 |
| 4,868,716 | 9/1989 | Taylor et al. | 174/35 R |
| 4,954,929 | 9/1990 | Baran | 174/36 X |
| 5,150,088 | 9/1992 | Virga et al. | 333/238 |
| 5,278,727 | 1/1994 | Westbrook et al. | 361/792 |
| 5,331,514 | 7/1994 | Kuroda | 361/760 |
| 5,334,800 | 8/1994 | Kenney | 174/35 R |
| 5,455,393 | 10/1995 | Ohshima et al. | 174/250 |
| 5,473,112 | 12/1995 | Doi | 174/35 |
| 5,587,920 | 12/1996 | Muyshondt et al. | 174/260 X |
| 5,677,515 | 10/1997 | Selk et al. | 174/233 |
| 5,712,607 | 1/1998 | Dittmer et al. | 333/246 X |

*Primary Examiner*—Benny T. Lee
*Attorney, Agent, or Firm*—Allen, Dyer, Doppelt, Milbrath & Gilchrist, P.A.

[57] ABSTRACT

A waveguide structure and a method of forming a waveguide structure is disclosed. The waveguide structure includes at least three dielectric layers juxtapositioned together such that two layers are positioned as outer layers. At least two intermediate signal path layers are positioned between respective dielectric layers. The outer dielectric layers each include a ground layer to form opposing ground planes. A controlled impedance signal track is formed at each intermediate signal path layer and a plurality of conductive vias interconnect the ground planes.

40 Claims, 6 Drawing Sheets

WAVEGUIDE WITH SIGNAL TRACK CROSS-OVER AND VARIABLE FEATURES

FIELD OF THE INVENTION

This invention relates to the field of waveguides, and more particularly, to a waveguide structure having at least one controlled impedance signal track positioned between outer ground planes.

BACKGROUND OF THE INVENTION

In copending patent application Ser. No. 09/076,422, filed May 12, 1998, and entitled "WAVEGUIDE WITH EDGE GROUNDING," now U.S. Pat. No. 6,072,375, the disclosure which is hereby incorporated by reference in its entirety, a waveguide structure included at least two dielectric layers having opposing, substantially planar faces and one intermediate signal path layer positioned between the faces. A conductive layer was formed on each of the opposing, substantially planar faces to form outer ground planes. At least one controlled impedance signal track was formed within the waveguide structure at the intermediate signal path layer. A plurality of conductive vias interconnected the ground planes and in one embodiment, a plurality of grounding lines interconnected the vias at the intermediate signal path layer. A conductive via was connected to all adjacent conductive vias outside the controlled impedance signal track to form an inner grounding line grid that was coplanar with the controlled impedance signal track to work in conjunction with the plurality of conductive vias for waveguide mode rejection.

The grounding lines could be formed as etched connections. In another aspect of that invention, there could be no grounding lines and the plurality of conductive vias could form a "sea" of vias that extend through the dielectric layers and interconnect the ground planes. An inner grounding line grid that is coplanar with the controlled impedance signal track could work in conjunction with the plurality or "sea" of vias for waveguide mode rejection. The controlled impedance signal track could be formed as a split branch controlled impedance signal track or as a number of separate controlled impedance signal tracks. The grounding lines could be coplanar with the controlled impedance signal tracks such that the grounding lines and conductive vias establish the etched grounding that not only enhances waveguide mode rejection, but also enhances shielding between various controlled impedance signal tracks.

In another aspect of the copending application, the waveguide structure includes two intermediate signal path layers with a signal path formed to cross from one intermediate signal path layer to the other intermediate signal path layer. The grounding lines could interconnect the vias at each of the intermediate signal path layers to form a grid that is coplanar with each of the intermediate signal path layers and signal paths.

The invention as disclosed and claimed was advantageous because it provided a waveguide structure that was advantageous over previous "waffle-line" technology. The waveguide of the present invention provided for high performance radio frequency (e.g., microwave) interconnects that could be built in a batch process for production line quantities. By using multilayer dielectric technology, such as the use of non-conductive dielectric layers, printed dielectric and/or circuit layer technology and low cost graphic fabrication processes could be used.

However, it would be advantageous if other features could be provided in a waveguide structure, such as different controlled impedance signal tracks formed at different layers and not interconnected to each other, and embedded devices, such as buried resistors. Additionally, it may not be desirable to extend all conductive vias to all layers.

SUMMARY OF THE INVENTION

It is therefore an object of the present invention to provide a waveguide structure having at least two different layers of controlled impedance signal tracks that can cross-over, contain buried components, and buried and blind conductive vias.

In accordance with the present invention, a waveguide structure comprises at least three dielectric layers that are juxtapositioned together such that two layers are positioned as outer layers. At least two intermediate signal path layers are positioned between respective dielectric layers. The outer dielectric layers each include a ground layer to form opposing ground planes. A controlled impedance signal track is formed at each of the intermediate signal path layers and a plurality of conductive vias interconnect the ground planes.

In accordance with another aspect of the present invention, the controlled impedance signal track extends in a direction to cross-over each other while remaining positioned at respective intermediate signal path layers. At least one of the controlled impedance signal tracks is Y-configured and forms a Y-junction. A resistor is formed at the Y-junction to form a power divider circuit. In still another aspect of the present invention, the dielectric layers are secured together and at least one controlled impedance signal track is formed as an etched controlled impedance signal track. The dielectric layers can be formed from filled Teflon or other low-loss dielectric material as known to those skilled in the art. The conductive vias are positioned to provide waveguide mode rejection for microwave and millimeter wave frequency ranges. The conductive vias are filled with a solid conductive material or plated through.

In still another aspect of the present invention, the waveguide structure can comprise at least three dielectric layers juxtapositioned together such that two layers are positioned as outer layers, and at least two intermediate signal path layers are positioned between respective dielectric layers. The outer dielectric layers each include a ground layer when the outer layers perform opposing ground planes. A controlled impedance signal track is formed at each intermediate signal path layer. At least one buried conductive via could extend between the intermediate signal path layers without contacting the ground planes. At least one blind conductive via could extend through the ground plane layer to an intermediate signal path layer and can interconnect with a buried via. The blind conductive via is isolated from the ground plane.

A method aspect of the present invention forms a waveguide structure and comprises the step of forming at least three dielectric layers and juxtapositioning the layers together such that two layers are positioned as outer layers. Intermediate signal path layers are formed between respective dielectric layers and a ground layer is formed on the outer layers to form opposing ground planes. A controlled impedance signal track is formed at each intermediate signal path layer. The method also comprises the step of forming a plurality of conductive vias interconnecting the ground planes.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout the different Figures and may not be all described in detail for all Figures.

The present invention is related to the claimed invention disclosed in the incorporated by reference patent application, Ser. No. 09/076,422. The present invention provides a waveguide structure that is advantageous over previous "waffle-line" technology. The waveguide of the present invention also provides for high performance radio frequency (e.g., microwave) interconnects that can be built in a batch process for production line quantities. By using multilayer dielectric technology, such as the use of non-conductive dielectric layers, printed dielectric and/or circuit layer technology and low cost lithographic fabrication processes can be used.

Energy is conducted in the intermediate signal path layers between two ground planes by the controlled impedance signal tracks formed at the intermediate signal path layers. The invention can be used for strip line and similar microstrip transmission lines, where flat conductors are positioned between two ground planes, or a conductive circuit is positioned between ground planes With this type of system, low cost production can be provided in large volumes. Also, components such as resistors and capacitors can be mounted and formed.

Figure 1:
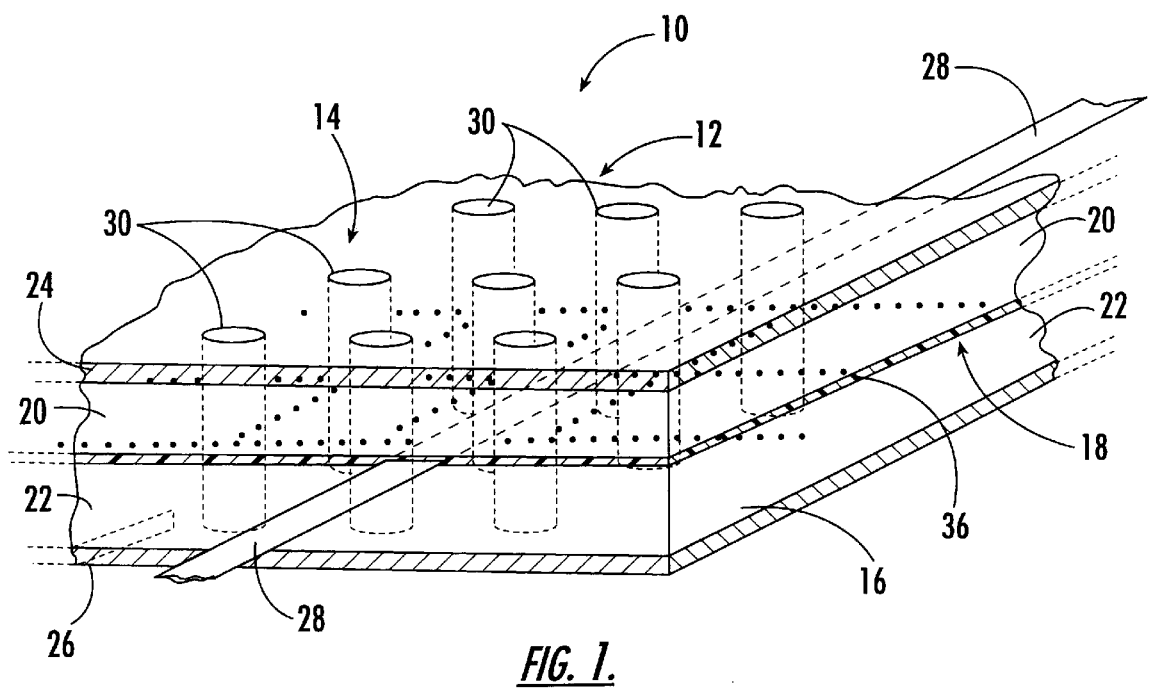
FIG. 1 is a schematic isometric view of a waveguide structure showing two opposing ground planes, conductive vias, parallel, and a controlled impedance signal track formed within the waveguide structure between the ground planes.
Figure 2:
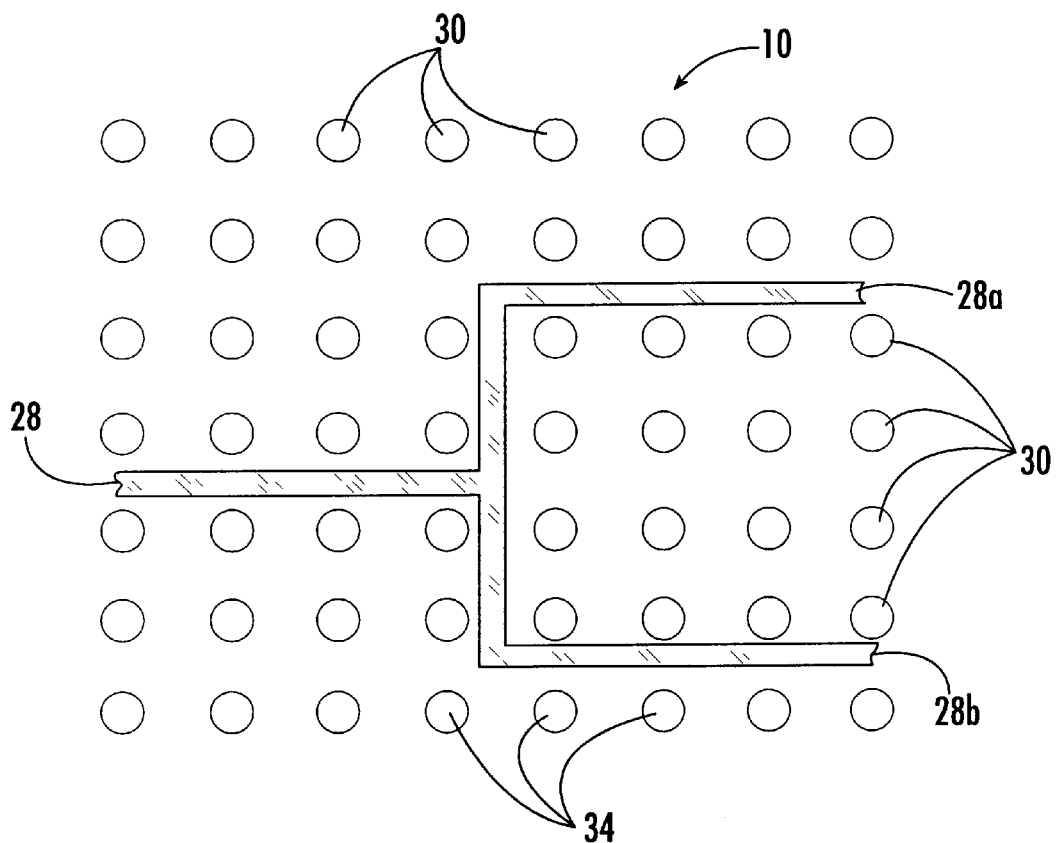
FIG. 2 is a plan view of a controlled impedance signal track that splits into two controlled impedance signal tracks.
Figure 3:
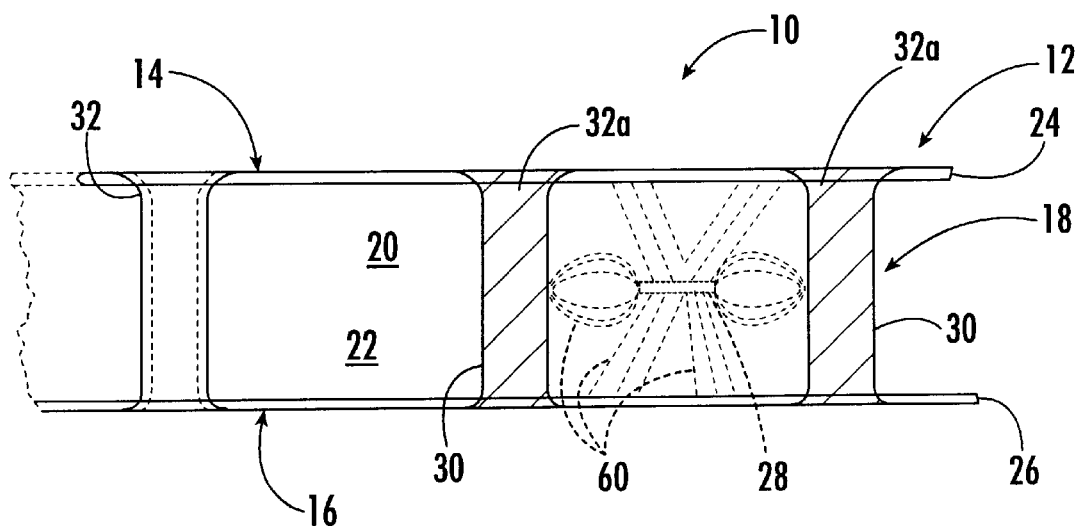
FIG. 3 is a partial side sectional view of the waveguide structure of FIG. 1 and showing the ground planes, conductive vias, and a controlled impedance signal track, and showing schematically the electric lines of force contained by the ground planes and grounding lines.

Referring now to FIGS. 1 and 2, there is illustrated generally at 10 a waveguide structure. As best seen in FIG. 1, the waveguide structure 10 is formed from a body 12 having respective opposing, substantially planar faces 14,16 and an intermediate signal path layer 18 positioned between the opposing faces. The body 12 can typically be formed from two respective dielectric layers 20,22 that can be laminated together or secured by appropriate means known to those skilled in the art. A typical example of a conductive layer that can be used in the present invention includes a layer that can be lithographically processed, such as by patterning and etching. Each dielectric layer includes a respective ground layer 24,26 positioned on one side thereof to form respective ground planes as illustrated in FIG. 1 and FIG. 3.

Figure 4:
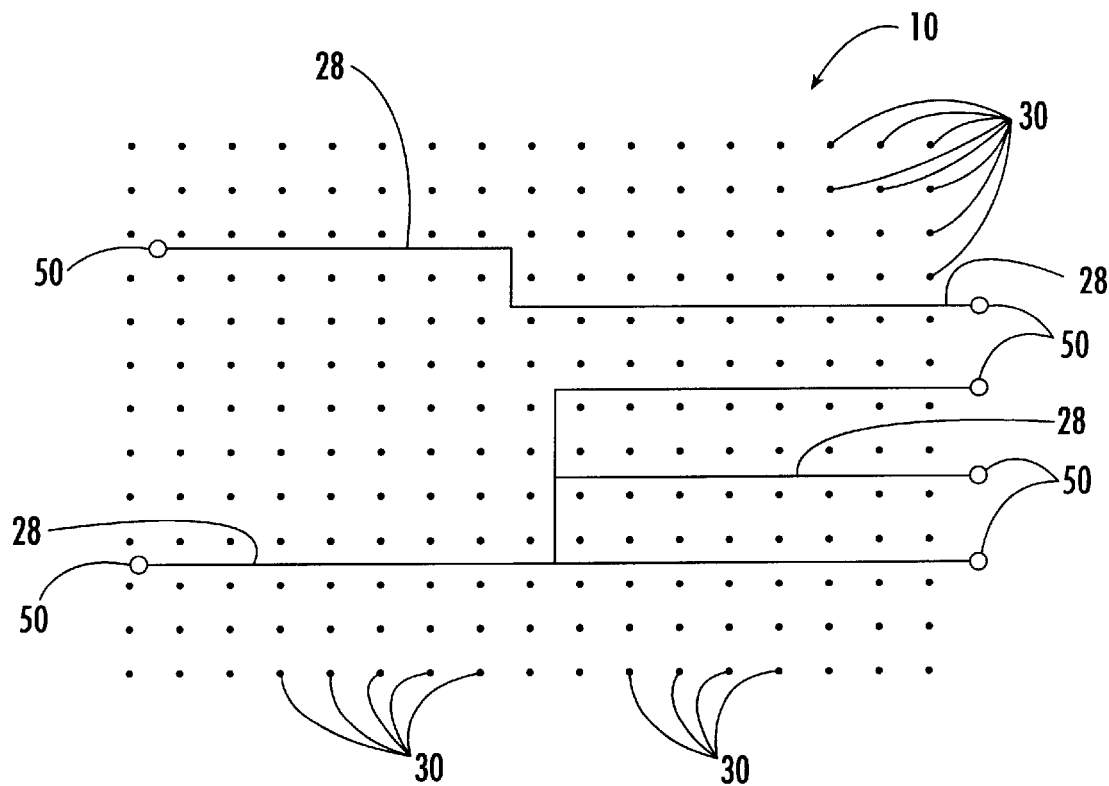
FIG. 4 is a schematic plan view of a portion of the waveguide structure showing various controlled impedance signal tracks and the position of vias.
Figure 5:
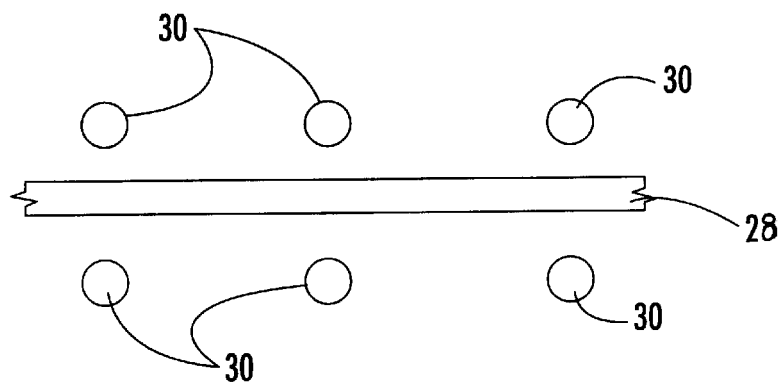
FIG. 5 is an enlarged plan view of a portion of the controlled impedance signal track.

A controlled impedance signal track 28 (see FIGS. 1 and 2) is formed at the intermediate signal path layer 18 (see FIG. 1) and typically can be formed by etching using standard photolithography methods or by using additive processes. The controlled impedance signal track 28 forms the path for the transmitted microwave radio frequencies. As shown in FIG. 2, the controlled impedance signal track 28 can be formed as more than one controlled impedance signal track 28 where the controlled impedance signal track splits into two component controlled impedance signal tracks 28a, 28b. FIG. 4 illustrates a schematic plan view where more than one controlled impedance signal track 28 is illustrated. Typically, depending on the size of the body 12, (see FIG. 1) the waveguide typically may include more than one controlled impedance signal track 28.

The waveguide structure is formed from dielectric layers. Its overall size can vary depending on end use, but typically will be about 18" by 18", giving a worker enough room to conduct production radio frequency work, but also provide a waveguide structure that is not unduly large so that it can be manually handled with little difficulty.

The dielectric layers can be formed from a number of different dielectric materials, and can include the appropriate conductive coatings. These materials can include random or woven glass Teflon, ceramic filled Teflon, ceramic thermoset resins, glass reinforced hydrocarbon/ceramic resins, glass reinforced organic/ceramic resins, and filled Teflon materials known to those skilled in the art, and other similar materials known to those skilled in the art.

As illustrated, in FIGS. 1, 2 and 4, a plurality of conductive vias 30 form a "sea" of vias and extend through the dielectric layers and interconnect the ground planes 24,26. The conductive vias 30 can be formed as plated through holes, where the initial holes formed by laser drilling, plasma etching, water jet or other techniques known to those skilled in the art after the various dielectric layers have been secured or laminated together. A conductive material, such as copper, could be used to form vias to connect the two ground planes 24,26. Additionally, in still another aspect of the present invention, the conductive vias 30 can be filled with a solid conductive material 32*a* (FIG. 3), such as a copper and epoxy resin, to provide the electrical connection between the two ground planes 24,26. In some instances, gold could also be used. However, the use of gold may not be economically feasible in production quantities.

As illustrated in FIG. 2, a "sea" of conductive via 30 is formed outside the controlled impedance signal track 28 for waveguide mode rejection (FIG. 2). In the broken isometric view of FIG. 1, the controlled impedance signal track 28 is shown by the solid/dashed horizontal line extending from left to right through the intermediate signal path layer 18. It is possible to have grounding lines shown by the dotted lines extending throughout the intermediate signal path layer. However, they are not essential.

The controlled impedance signal tracks are established before the waveguide substrate is completed and can be formed by standard photolithographic techniques known to those skilled in the art, including subtractive or additive photolithographic processes. As is conventional, a copper-clad laminate receives a printed configuration with an acid resist on a foil surface. Etching removes the unwanted surface areas leaving the foil pattern of the controlled impedance signal track. It should be understood that the controlled impedance signal track 28 can be formed on a thin film layer 36 (FIG. 1) sandwiched between two dielectric layers containing the ground plane. The choice of substrate and method will vary depending on end use and the selections of those skilled in the art.

During manufacture, the various substrates and components are formed, e.g., (1) dielectric layers 20,22; (2) the intermediate substrate or thin film layer (if any) having the controlled impedance signal track; and (3) the outer ground layers 24,26. Once these layers are completed, they are secured together, such as by lamination techniques known to those skilled in the art. The conductive vias 30 are then formed as plated through holes. The conductive vias can be positioned depending on the frequencies used. The spacing can allow waveguide mode rejection for microwave and millimeter wave frequency ranges.

In one aspect of the present invention, the conductive vias are positioned adjacent to the controlled impedance signal track 28, and the requisite number of holes forming a "sea" or large plurality of holes is used and provide waveguide mode rejection.

Figure 6:
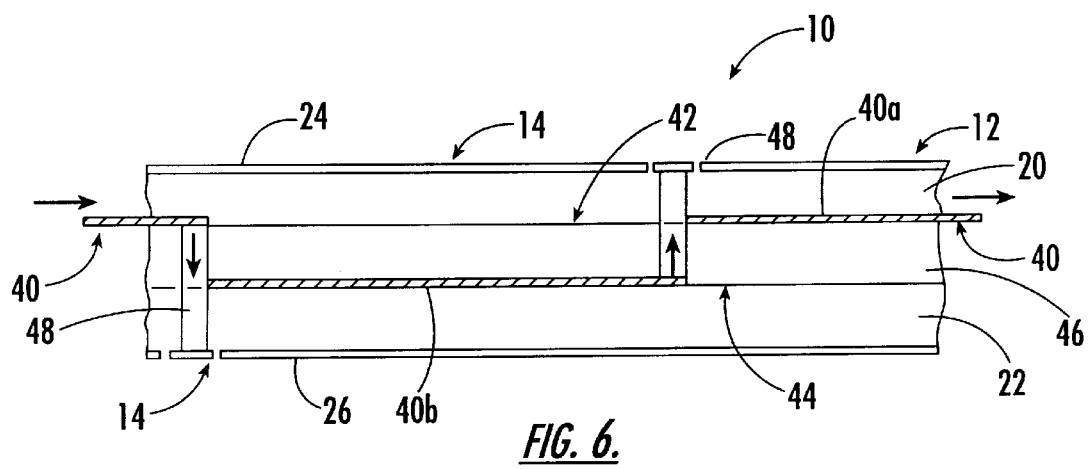
FIG. 6 is a sectional view of a waveguide structure formed from three dielectric layers, and showing two intermediate signal path layers connected by conductive vias.
Figure 7:
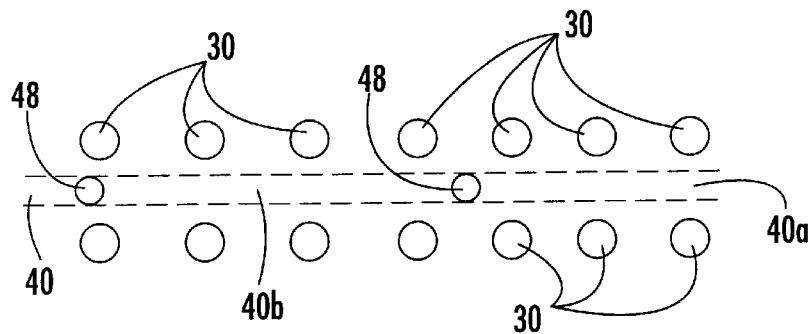
FIG. 7 is a schematic plan view of a multilayer waveguide structure of FIG. 6, and showing a conductive via that intersects a signal path at one level to connect a signal path at another level.
Figure 8:
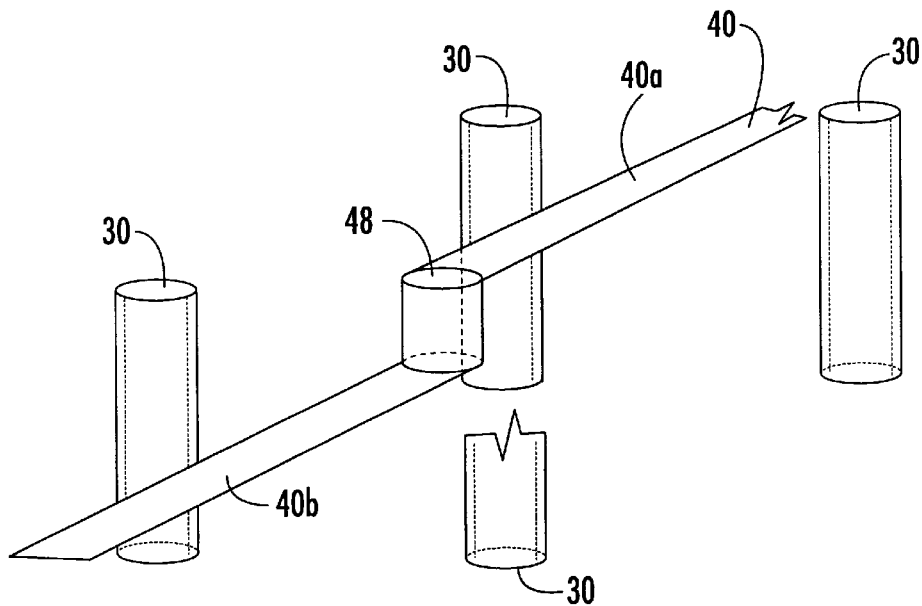
FIG. 8 is a schematic isometric view of the conductive via that can be used in the structure of FIGS. 6 and 7.

As illustrated in FIGS. 6, 7 and 8, it is also possible to form a three dimensional controlled impedance signal track 40 when at least two intermediate signal path layers 42,44 are formed as shown in FIG. 6. The two layers 42,44 could be formed by using a third dielectric layer 46 or similar structure as shown in FIG. 6. The structure forms upper and lower controlled impedance signal tracks 40*a*, 40*b*.

The controlled impedance signal tracks 40*a*, 40*b* could be formed by conventional photolithographic techniques known to those skilled in the art (e.g., etching) or additive processes on the layers as described before. It is also possible to use two thin film substrates (not shown) to form the upper and lower controlled impedance signal tracks.

As best illustrated in FIGS. 7 and 8, another conductive via 48 is drilled on which the controlled impedance signal track extends so as to connect the controlled impedance signal track 40*b* positioned on a lower intermediate signal path layer 44 onto the upper intermediate signal path layer 42, as shown in FIGS. 6, 7 and 8. Thus, a shielded waveguide path is formed.

The waveguide can include edge or top connections 50 (see FIG. 4) or other connection points to connect the controlled impedance signal tracks to a source of microwave or other radio frequency. The signals pass through the controlled impedance signal tracks located at one or more intermediate signal path layers. The sectional view of FIG. 3 illustrates schematically the electric lines of force 60 generated through the controlled impedance signal track, and how the ground planes 24,26, and conductive vias tied to the ground planes provide the necessary shielding.

Figure 9:
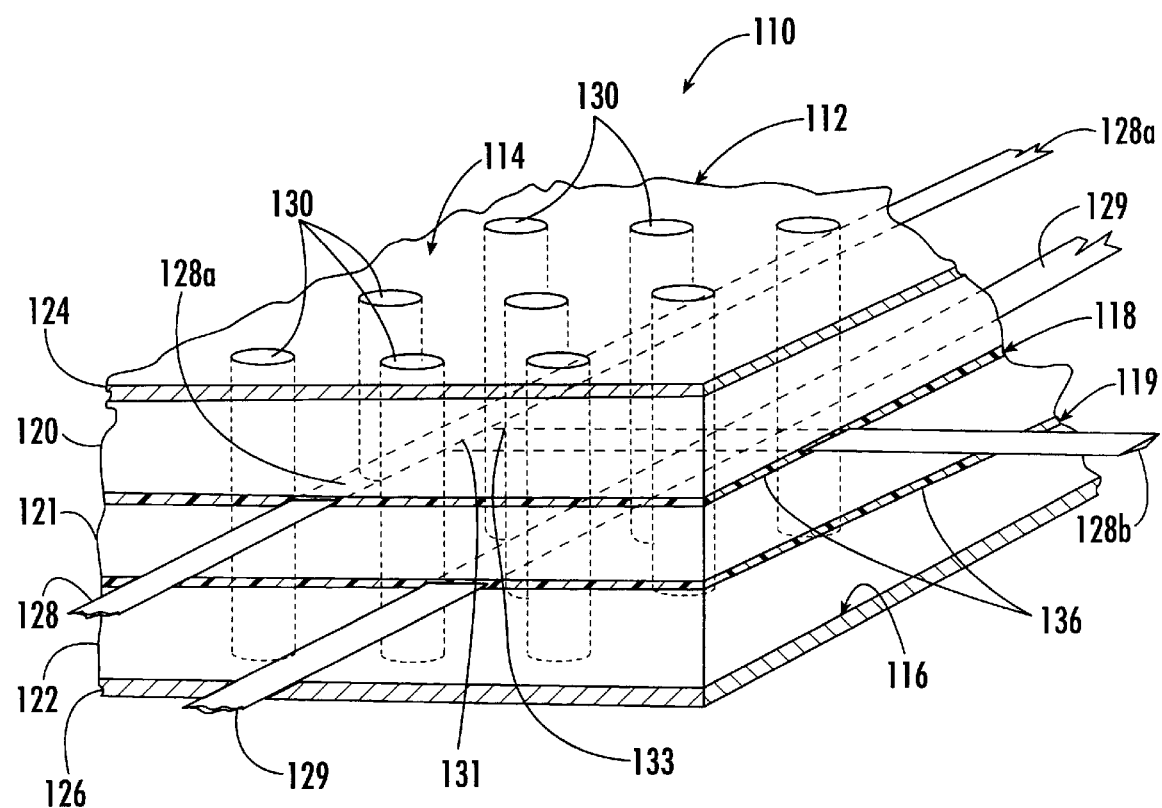
FIG. 9 is a schematic isometric view of the waveguide structure of the present invention showing two opposing ground planes, conductive vias, and two controlled impedance signal tracks formed within the waveguide structure on two different signal path layers between the ground planes, with one signal track split into a Y-configuration with a buried resistor.
Figure 10:
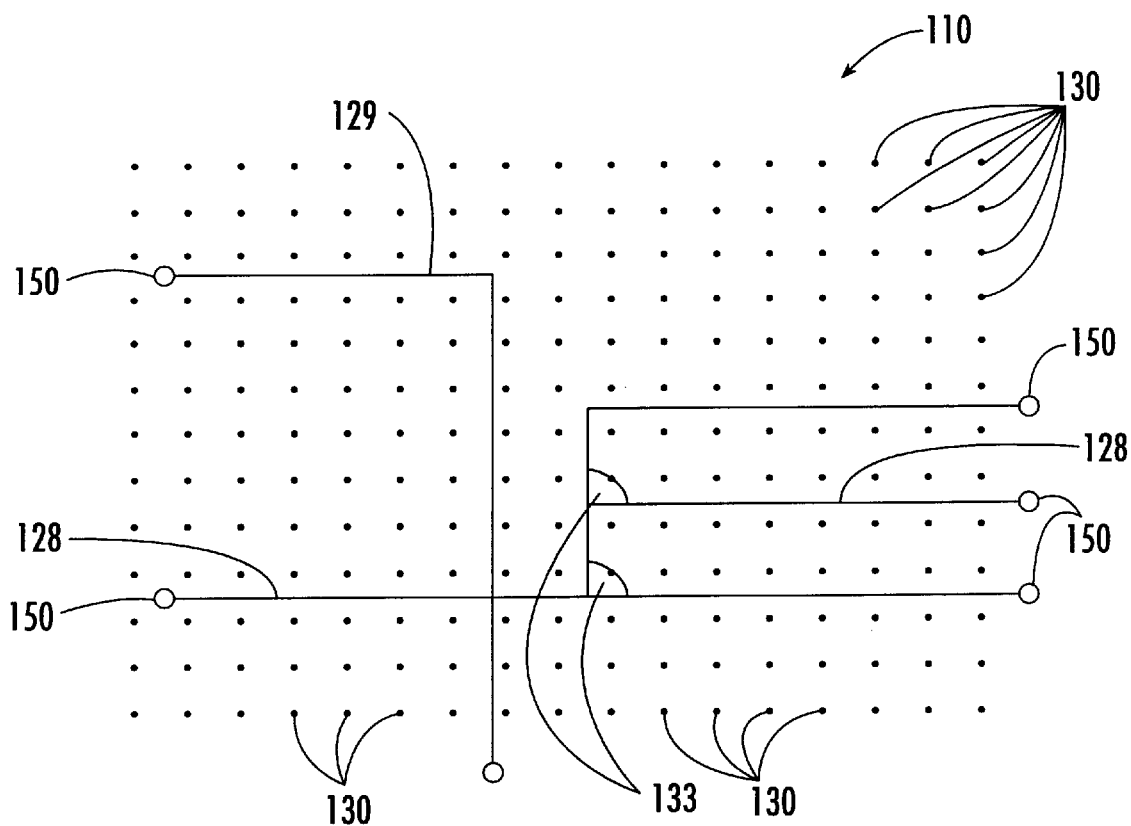
FIG. 10 is a schematic plan view of a portion of a waveguide structure of the present invention showing two controlled impedance signal tracks with one of the tracks formed on a different layer and having a Y-configuration with a buried resistor to form a power divider circuit.
Figure 11:
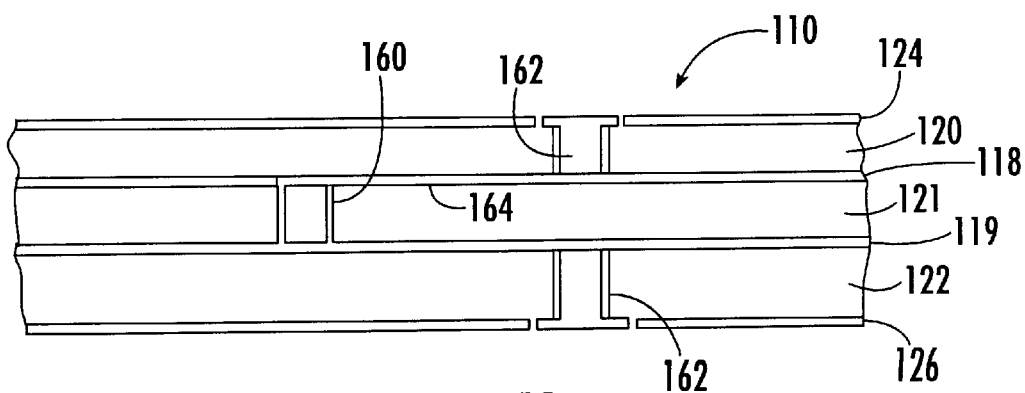
FIG. 11 is a schematic side sectional view of the waveguide structure formed from three different dielectric layers and showing two intermediate signal path layers with blind vias and a buried via.

FIG. 9 discloses a waveguide structure of the present invention. For purposes of clarity, reference numerals describing the waveguide structure of FIGS. 9–11 are similar to the reference numerals describing similar elements of FIGS. 1–8, except starting in the 100 series. As shown in FIG. 9, the waveguide structure 110 is formed from a body 112, having at least three dielectric layers 120,121,122, which are juxtapositioned together. Two layers 120,122 are positioned as outer layers and form planar faces 114,116, and at least two intermediate signal path layers 118,119 are positioned between respective dielectric layers, as illustrated in FIG. 9. The outer dielectric layers 120,122 each include a ground layer 124,126 to form opposing ground planes. Conductive vias 130 are formed as plated through holes, and are structured similar to the "sea" of conductive vias 30 as set forth in reference to FIG. 2.

As shown in FIG. 10 and illustrated in the isometric view of FIG. 9, a controlled impedance signal track 128,129 is formed at each intermediate signal path layer 118,119. As shown in FIGS. 9 and 10, the controlled impedance signal tracks 128,129 extend in a direction and cross-over each other while remaining positioned at intermediate signal path layers. This is evident in the second controlled impedance signal track 129 that extends through the body 112 as shown in FIG. 9, and in the first controlled impedance signal track 128 that is positioned at the first intermediate signal path layer 118 and extends longitudinally through the body and parallel to the second controlled impedance signal track. The first signal track 128 includes a branch to form a Y-junction 131 with branches 128*a*, 128*b* that extend off of the first part or leg 128*c*. A resistor 133 is also formed in the first intermediate signal path layer at the junction 131 to form a power divider circuit. Although a resistor is illustrated, other electronic components can be formed at other points in the circuit, including capacitors and inductors, known to those skilled in the art. Naturally, one or more junctions and branches could be formed on one or all layers. There could be any number of branches on one or all layers.

FIG. 10 illustrates another schematic plan view where a first signal track has three branches. A "sea" of conductive vias 130 are illustrated, which can also be filled with a solid conductive material as noted before. The signal tracks can also be formed on thin film layers 136 as shown in FIG. 9 between the dielectric layers. Edge connectors 150 are also illustrated in FIG. 10C. The conductive vias 130 are structured similar to the "sea" of conductive vias 30 as set forth with reference to FIG. 2.

FIG. 11 illustrates in detail a sectional view of a waveguide structure 110 where at least one conductive via 160 is buried and extends only between the intermediate signal path layers 118,119 without contacting the ground planes. A plurality of blind conductive vias 162 extend through the outside ground planes to the intermediate signal path layers 118,119, and a circuit or other means, such as a signal track 164, interconnects at least the two blind vias 162 with a buried via 160 as illustrated. The blind vias are isolated from the ground planes.

It is evident that the present invention is advantageous because printed circuit technology can be used without the more conventional "waffle-line" technology commonly used in production quantities.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A waveguide structure comprising:
   at least three dielectric layers juxtapositioned together such that two layers of said at least three dielectric layers are positioned as outer layers, and at least two intermediate signal path layers positioned between respective dielectric layers, wherein said outer dielectric layers each includes a respective ground layer to provide opposing outer ground planes;
   a respective controlled impedance signal track provided at each intermediate signal path layer; and
   a plurality of conductive vias interconnecting said ground planes on either side of said controlled impedance signal track and extending through respective said dielectric layers and providing a grid pattern on either side of said controlled impedance signal track.

2. A waveguide structure according to claim 1, wherein said respective controlled impedance signal tracks extend in a corresponding direction to crossover each other while remaining positioned at respective intermediate signal path layers.

3. A waveguide structure according to claim 1, wherein at least one of said controlled impedance signal tracks is configured to provide a junction, and including a resistor provided at said junction and thereby providing a power divider circuit.

4. A waveguide structure according to claim 1, and further comprising means for securing said dielectric layers together.

5. A waveguide structure according to claim 1, wherein said respective controlled impedance signal track is provided as an etched controlled impedance signal track.

6. A waveguide structure according to claim 1, wherein said dielectric layers are comprised of filled polytetrafluoroethylene or other low-loss dielectric material.

7. A waveguide structure according to claim 1, wherein said conductive vias are positioned to provide waveguide mode rejection for signals over microwave and millimeter wave frequency ranges.

8. A waveguide structure according to claim 1, wherein said conductive vias are filled with a solid conductive material.

9. A waveguide structure comprising:
   at least three dielectric layers juxtapositioned together such that two layers of said at least three dielectric layers are positioned as outer layers, and at least two intermediate signal path layers positioned between respective dielectric layers, wherein said outer dielectric layers each includes a respective ground layer on the corresponding outer layers to provide opposing ground planes;
   a respective controlled impedance signal track provided at each intermediate signal path layer; and
   a buried conductive via that extends between the at least two intermediate signal path layers, and at least one blind conductive via that extends adjacent and isolated from the ground planes, and a signal track that interconnects said buried conductive via with the at least one blind conductive via.

10. A waveguide structure according to claim 9, wherein said respective controlled impedance signal tracks extend in a corresponding direction to crossover each other while remaining positioned at respective intermediate signal path layers.

11. A waveguide structure according to claim 9, wherein said controlled impedance signal tracks is configured to provide a junction, and including a resistor provided at said junction and thereby providing a power divider circuit.

12. A waveguide structure according to claim 9, and further comprising means for securing said dielectric layers together.

13. A waveguide structure according to claim 9, wherein said respective controlled impedance signal track is provided as an etched controlled impedance signal track.

14. A waveguide structure according to claim 9, wherein said dielectric layers are comprised of filled polytetrafluoroethylene or other low-loss dielectric material.

15. A waveguide structure according to claim 9, wherein said at least one conductive via is provided as a plated through hole.

16. A waveguide structure according to claim 9, wherein said at least one conductive via is positioned to provide waveguide mode rejection for signals over microwave and millimeter wave frequency ranges.

17. A waveguide structure according to claim 9, wherein said at least one blind conductive via is filled with a solid conductive material.

18. A waveguide structure comprising:
    at least three dielectric layers juxtapositioned together such that two layers of said at least three dielectric layers are positioned as outer layers, and at least two intermediate signal path layers positioned between respective dielectric layers, wherein said outer dielectric layers each includes a respective ground layer on the corresponding outer layers to provide opposing ground planes;
    a respective controlled impedance signal track provided at each intermediate signal path layer; and
    a plurality of plated through holes extending through said dielectric layers and interconnecting said ground planes on either side of said controlled impedance signal track and extending through respective said dielectric layers and providing a grid pattern on either side of said controlled impedance signal track.

19. A waveguide structure according to claim 18, wherein said respective controlled impedance signal tracks extend in a corresponding direction to crossover each other while remaining on their respective intermediate signal path layers.

20. A waveguide structure according to claim 18, wherein at least one of said controlled impedance signal tracks is configured to provide a junction, and including a resistor provided at said junction and thereby providing a power divider circuit.

21. A waveguide structure according to claim 18, and further comprising means for securing said dielectric layers together.

22. A waveguide structure according to claim 18, wherein said respective controlled impedance signal track is provided as an etched controlled impedance signal track.

23. A waveguide structure according to claim 18, wherein said dielectric layers are comprised of filled polytetrafluoroethylene or other low-loss dielectric material.

24. A waveguide structure according to claim 18, wherein said plated through holes are positioned to provide waveguide mode rejection for signals over microwave and millimeter wave frequency ranges.

25. A method of forming a waveguide structure comprising the steps of:

forming at least three dielectric layers and juxtapositioning the layers together such that two layers of said at least three dielectric layers are positioned as outer layers, and forming intermediate signal path layers between respective dielectric layers, and forming a respective ground layer on the corresponding outer layers to form opposing ground planes;

forming a respective controlled impedance signal track at each intermediate signal path layer; and forming a plurality of conductive vias interconnecting said ground planes on either side of the controlled impedance signal track and extending through respective said dielectric layers and forming a grid pattern on either side of said controlled impedance signal track.

26. A method according to claim 25, and further comprising the step of forming the conductive vias to provide waveguide mode rejection for signals over microwave and millimeter wave frequency ranges.

27. A method according to claim 25, and further comprising the step of filling the conductive vias with a solid conductive material.

28. A method according to claim 25, and further comprising the step of extending the respective controlled impedance signal tracks to extend in a corresponding direction to crossover each other while remaining on their respective intermediate signal path layers.

29. A method according to claim 25, and further comprising the step of forming at least one of the controlled impedance signal tracks as a junction, and including forming a resistor at said junction thereby forming a power divider circuit.

30. A method according to claim 25, and further comprising the step of forming the respective controlled impedance signal track as an etched controlled impedance signal track.

31. A method according to claim 25, and further comprising the steps of forming the dielectric layers from filled polytetrafluoroethylene or other low-loss dielectric material.

32. A method of forming a waveguide structure comprising the steps of:

forming at least three dielectric layers and juxtapositioning the layers together such that two layers of said at least three dielectric layers are positioned as outer layers, and forming at least two intermediate signal path layers positioned between respective dielectric layers, and forming a respective ground layer on the corresponding outer layers to form opposing ground planes;

forming a respective controlled impedance signal track at each intermediate signal path layer; and forming a buried conductive via between the intermediate signal path layers, and forming at least one blind conductive via that extends through and isolated from the ground planes and interconnecting the buried via with the at least one blind conductive via with a signal track.

33. A method according to claim 32, and further comprising the step of forming the blind conductive vias to provide waveguide mode rejection for signals over microwave and millimeter wave frequency ranges.

34. A method according to claim 32, and further comprising the step of filling the conductive vias with a solid conductive material.

35. A method according to claim 32, and further comprising the step of extending the respective controlled impedance signal tracks in a corresponding direction to crossover each other while remaining on their respective intermediate signal path layers.

36. A method according to claim 32, and further comprising the steps of forming at least one of the controlled impedance signal tracks as a junction, and including forming a resistor at the junction thereby forming a power divider circuit.

37. A method according to claim 32, and further comprising means for securing said dielectric layers together.

38. A method according to claim 32, and further comprising the step of forming the respective controlled impedance signal track as an etched controlled impedance signal track.

39. A method according to claim 32, and further comprising the steps of forming the dielectric layers forming from filled polytetrafluoroethylene or other low-loss dielectric material.

40. A method according to claim 32, wherein said conductive vias are formed as plated through holes.

* * * * *

UNITED STATES PATENT AND TRADEMARK OFFICE
CERTIFICATE OF CORRECTION

PATENT NO. : 6,163,233
DATED : December 19, 2000
INVENTOR(S) : Adkins

It is certified that error appears in the above-identified patent and that said Letters Patent is hereby corrected as shown below:

Column 10, line 43    Delete:
"the steps of forming the dielectric layers forming"

Substitute:
"the steps of forming the dielectric layers"

Signed and Sealed this

Twenty-ninth Day of May, 2001

Attest:

NICHOLAS P. GODICI

Attesting Officer    Acting Director of the United States Patent and Trademark Office